United States Patent
Besser et al.

(10) Patent No.: US 6,461,951 B1
(45) Date of Patent: Oct. 8, 2002

(54) METHOD OF FORMING A SIDEWALL SPACER TO PREVENT GOUGING OF DEVICE JUNCTIONS DURING INTERLAYER DIELECTRIC ETCHING INCLUDING SILICIDE GROWTH OVER GATE SPACERS

(75) Inventors: Paul Besser, Sunnyvale; Angela Hui, Fremont; Yowjuang W. Liu, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/280,662

(22) Filed: Mar. 29, 1999

(51) Int. Cl.$^7$ .................... H01L 21/3205; H01L 21/44
(52) U.S. Cl. .................... 438/592; 438/595; 438/586; 438/655; 257/413
(58) Field of Search .................... 438/233, 592, 438/595, 586, 655; 257/413

(56) References Cited

U.S. PATENT DOCUMENTS

| | | | |
|---|---|---|---|
| 4,593,454 A | * | 6/1986 | Baudrant et al. |
| 4,908,331 A | * | 3/1990 | Raaijmakers |
| 5,268,330 A | * | 12/1993 | Givens et al. |
| 5,683,941 A | * | 11/1997 | Kao et al. |
| 5,693,972 A | | 12/1997 | Liu |
| 5,783,479 A | * | 7/1998 | Lin et al. |
| 5,889,331 A | | 3/1999 | Bai |
| 6,048,784 A | * | 4/2000 | Hong et al. .................... 438/592 |
| 6,194,297 B1 | * | 2/2001 | Cheng .................... 438/592 |

* cited by examiner

Primary Examiner—John F. Niebling
Assistant Examiner—Ron Pompey

(57) ABSTRACT

A method and arrangement for forming a recessed spacer to prevent the gouging of device junctions during a contact etch or local interconnect etch process deliberately overetches the spacer material layer during the formation of sidewall spacers on the sidewalls of a gate. The exposed portions of the gate sidewalls are then covered by silicide formed during a silicidation process. The formation of the suicide on the gate sidewalls prevents the sidewall spacers from being preferentially attacked during a local interconnect etch or contact etch.

11 Claims, 4 Drawing Sheets

METHOD OF FORMING A SIDEWALL SPACER TO PREVENT GOUGING OF DEVICE JUNCTIONS DURING INTERLAYER DIELECTRIC ETCHING INCLUDING SILICIDE GROWTH OVER GATE SPACERS

FIELD OF THE INVENTION

The present invention relates to a method of manufacturing high-density integrated semiconductor devices such as MOS transistors and CMOS devices formed in or on a semiconductor wafer substrate and having low resistance, ultra-shallow junctions forming low junction leakage source and drain regions by utilizing self-aligned, refractory metal suicide ("salicide") processing. The invention has particular utility in contact formation or local interconnect formation processes.

BACKGROUND OF THE INVENTION

The escalating requirements for high-density and performance associated with ultra-large scale integration semiconductor devices necessitate design rules of 0.18 μm and below, increased transistor and circuit speeds, high reliability and increased manufacturing throughput. The reduction of design features, e.g., of source, drain, and gate regions of transistors formed in or on a common semiconductor substrate, challenges the limitations of conventional junction and contact formation technology, including photolithographic, etching, and deposition techniques.

As a result of the ever increasing demand for large-scale and ultra-small dimension integrated semiconductor devices, self-aligned techniques have become the preferred technology for forming such devices in view of their simplicity and capability of high-density integration. As device dimensions decrease, both vertically and laterally, many problems arise, especially those caused by an increase in sheet resistance of the contact areas to the source and drain regions and junction leakage as junction layer thickness decreases. To overcome this problem, the use of highly electrically conductive refractory metal silicides has become commonplace in the manufacture of integrated semiconductor devices comprising, e.g., MOS type transistors. Another technique employed in conjunction with refractory metal silicide technology is the use of lightly doped drains ("LDDs"). An LDD consists of a lightly doped source/drain region (i.e., dopant densities on the order of about $9\times10^{19}$ da/cm$^3$) formed just at the edge of the gate region, while a more heavily doped drain region (i.e., dopant densities on the order of about $2\times10^{20}$ da/cm$^3$), to which ohmic contact is to be provided, is laterally displaced away from the gate by provision of a sidewall spacer on the gate electrode.

Salicide processing involves deposition of a metal that forms an intermetallic compound with silicon, but does not react with silicon oxides or silicon nitrides during normal processing conditions.

Refractory metals commonly employed in salicide processing include titanium, nickel, and cobalt, each of which forms very low resistivity phases with silicon, e.g., TsSi$_2$, NiSi and CoSi$_2$. In practice, the refractory metal is deposited in a uniform thickness over all exposed surface features of the silicon wafer, preferably by means of physical vapor deposition (PVD) from an ultra-pure sputtering target and an ultrahigh vacuum, multi-chamber DC magnetron sputtering system. In MOS transistor formation, deposition is generally performed both after gate etch and after source/drain junction formation. After deposition, the refractory metal blankets the polysilicon gate electrode, the silicon oxide or nitride spacers, the silicon oxide isolation regions, and the exposed portions of the source and drain regions. As a result of a rapid thermal annealing (RTA) process performed in an inert atmosphere, the refractory metal reacts with underlying polysilicon and silicon to form electrically conductive silicide layer portions on the top surface of the gate electrode and on the exposed portions of the source and drain regions. Unreacted portions of the refractory metal, e.g., on the silicon oxide or silicon nitride sidewall spacers and the silicon oxide isolation regions, are then removed. This may be done by a wet etch process which is selective to the metal silicide portions. In some instances, e.g., with cobalt, a first RTA step may be performed at a relatively low temperature from about 400° C. to about 550° C. for 20 sec to 120 sec in order to form first-phase CoSi which is then subjected to a second RTA step performed at a relatively high temperature from about 700° C. to about 850° C. for from about 20 sec to about 60 sec to convert the CoSi to second-phase, lower resistivity CoSi$_2$. The second RTA step is performed after selective etch of the non-reacted cobalt.

Taking advantage of the increasing number of devices provided by ultra-large scale integration and the continued shrinking of the device and circuit features requires formation of the devices into one or more circuits, necessitating the interconnection of these various devices. To accomplish interconnection on such a small scale, a local interconnect is typically used within an integrated circuit to provide an electrical connection between two or more conducting or semiconducting regions (e.g., active regions of one or more devices). For example, a plurallity of transistors can be connected to form an inverting logical circuit using local interconnects.

The local interconnect is typically a relatively low resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as a via or a trench that connects the selected regions. The use of local interconnects reduces the coupling burden on the subsequently formed higher layers to provide such connectivity, which reduces the overall circuit size and as such tends to increase the circuit's performance.

The combination of the salicidation process and the local interconnect formation process creates certain difficulties. In particular, the etching of an interlayerer dielectric (ILD) to form the via or trench in which the local interconnects are formed often overetches the LDD sidewall spacers on the sidewalls of the gate. This is due to the preferential attacking of the spacer material (such as an oxide) that comprises the sidewall spacers. This is known as "gouging" of the device junctions. This gouging leads to undesirable sidewall profiles and possibly can produce shorts.

SUMMARY OF THE INVENTION

There is a need for a method of forming an electrical connection, such as a contact or a local interconnect, that does not gouge device junctions during the etching process caused by preferential etching of the spacers.

This and other needs are met by the present invention which provides a method of forming an electrical connection to a semiconductor device comprising the steps of forming a gate on a substrate, this gate having a top surface and sidewalls. A layer of spacer material is deposited over the substrate and the gate. The layer of spacer material is etched to form sidewall spacers on the sidewalls of the gate. This etching is performed so that portions of the gate sidewalls are free of spacer material and other portions of the gate sidewalls are covered by the sidewall spacers. A silicide is formed on the semiconductor device. The silicide is formed on the top surface and those portions of the gate sidewalls that are free of spacer material.

The deliberate etching of the spacer material to expose portions of the gate sidewalls during the formation of the sidewall spacers allows the silicide to be formed on the gate sidewalls. During the subsequent local interconnect or contact etch, the spacer and an LDD oxide will not be preferentially attacked during a contact etch or a local interconnect etch. This prevents the gouging of the device junctions and undesirable profiles or possible shorts.

The earlier stated needs are also met by another embodiment of the present invention which provides an arrangement comprising a substrate and a gate on the substrate, with the gate having sidewalls and a top surface. Active regions are formed in the substrate. Sidewall spacers cover a portion of the gate sidewalls. Silicide regions are on the active regions, the gate top surface and the gate sidewalls.

An advantage of the arrangement of the present invention is the presence of silicide regions on the gate sidewalls that serve to prevent the preferential attacking of the sidewall spacers that cover the remaining portions of the gate sidewalls. Hence, during local interconnect or contact etch, neither the LDD oxide nor the sidewall spacers are preferentially attacked and the desirable profiles of the spacer is maintained and possible shorts are prevented.

In another embodiment of the present invention, a method of preventing gouging of device junctions during the formation of an electrical connection to the device junctions is provided. This method comprises the steps of forming a spacer layer over a semiconductor device having active regions and a gate with a top surface and sidewalls. The spacer layer is etched to form sidewall spacers. The step includes overetching the sidewall spacers to remove the sidewall spacers from portions of the gate sidewalls. Silicide regions are formed on the active regions, the gate top surface and the gate sidewalls.

An advantage of the method of the present invention is the relative ease of preventing the gouging that may occur during the contact etch or local interconnect etch. The present invention achieves this without adding a process step by continuing the etching to the spacer layer to overetch the sidewall spacers. Hence, a separate step of etching to remove the sidewall spacers from portions of the gate sidewalls is not required according to embodiments of the present invention. At the same time, however, the overetching of the sidewall spacers allows silicide regions to be formed on the gate sidewalls, which then prevent the LDD oxide and the sidewall spacers from being preferentially attacked during the contact etch or local interconnect etch.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DETAILED DESCRIPTION OF THE INVENTION

The present invention solves the problem of gouging of device junctions which may occur during contact etch or local interconnect etch of a dielectric layer to silicide regions. This is accomplished by the deliberate overetching of the spacer material layer during the formation of the sidewall spacers on the sidewalls of the polysilicon gate. This deliberate overetching of the spacer material layer exposes portions of the gate sidewalls. When the silicide regions are formed on the polysilicon gate and the active regions, the silicide is formed on the gate sidewalls. This serves to protect the sidewall spacers from being preferentially attacked during the local interconnect or contact etch, and thereby prevents the gouging that leads to undesirable profiles or possibly shorts.

Figure 1:
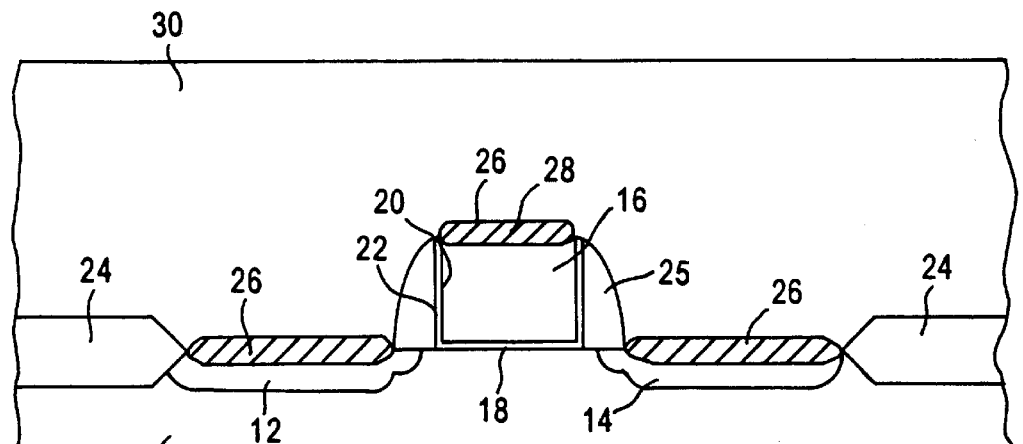
FIG. 1 depicts a cross-section of a semiconductor wafer prior to the etching of a local interconnect opening in a dielectric layer in accordance with conventional processing techniques.

FIG. 1 is a cross-section of a portion of a semiconductor wafer manufactured in accordance with conventional processing techniques. A semiconductor device is formed on the wafer and includes a substrate 10 in which active regions 12, 14 are formed. A polycrystalline silicon (hereafter polysilicon) gate 16 is provided on the substrate 10. The gate 16 is formed on a gate oxide 18 and an LDD (lightly doped drain) oxide 20 is formed on the sidewalls of the gate 18.

The semiconductor device is isolated from other devices by a field oxide formed by the shallow trench isolation technique (STI) in regions 24. Low resistivity silicide regions 26 are formed on the active regions 12, 14 and the top surface 28 of the gate 16. The suicide regions are typically made of cobalt suicide, or titanium silicide, for example. The suicide regions 26 provide a low resistivity contact to the active regions and the gate of the semiconductor device. A layer of tetraethyl orthosilicate (TEOS) 30 is deposited over the wafer. Silicon dioxide derived from this TEOS layer 30 serves as a dielectric material.

Figure 2A:
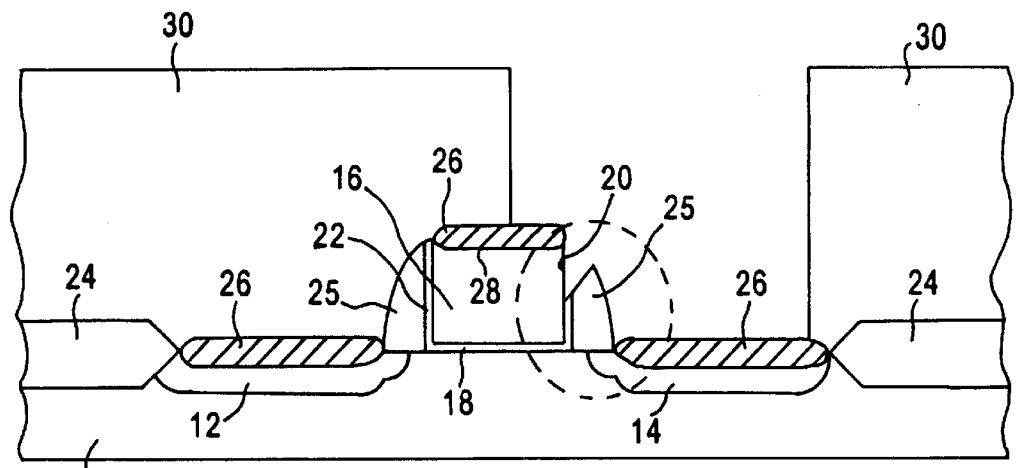
FIG. 2A depicts the cross-section of the portion of the semiconductor wafer of FIG. 1 following etching through the dielectric layer in accordance with conventional etching techniques.

FIG. 2A depicts the portion of the semiconductor wafer FIG. I following the etching of the dielectric layer 30 in accordance with conventional processing techniques. The etching is performed with an etchant chemistry that is highly selective to the suicide so that it is not etched to any significant degree. Following the etch of the dielectric layer 30, conductive material will be filled into the opening in order to make the desired local interconnection. During this etching process of the dielectric layer 30, however, the phenomenon of gouging has been observed. This may better be seen in the enlargements of the circled area in FIG. 2A provided in FIGS. 2B and 2C.

Figure 2B:
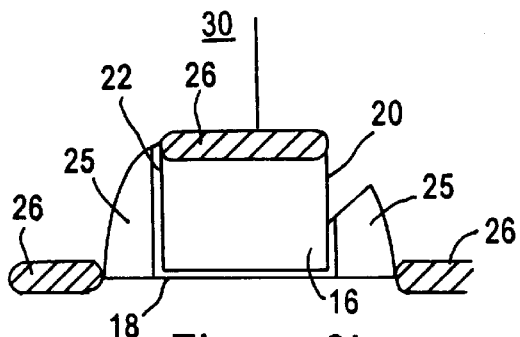
FIG. 2B is an enlarged view of a portion of the semiconductor device depicted in FIG. 2A following the etching of the local interconnect opening.

FIG. 2B depicts one possible result of the preferential attacking of a sidewall spacer 25 by the contact or local interconnect etch process. As can be seen in this enlargement, some of the LDD oxide 20 and the sidewall spacer 25 have been preferentially attacked and etched away from the sidewall 20 of the gate 16. This exposes a portion of a gate sidewall 22.

Figure 2C:
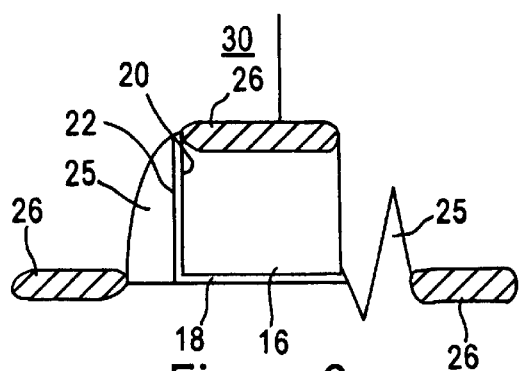
FIG. 2C depicts another outcome of the etching of the local interconnect opening in accordance with conventional processing techniques, similar to the view of FIG. 2B.

A more extreme example of the preferential attacking of the LDD oxide 20 and sidewall spacer 25 is depicted in FIG. 2C in which the gouging extends all the way into the active region 14 (or device junction) itself. When the local interconnect opening is filled with conductive material, a short may occur due to the gouging created by the local interconnect etch.

Figure 3:
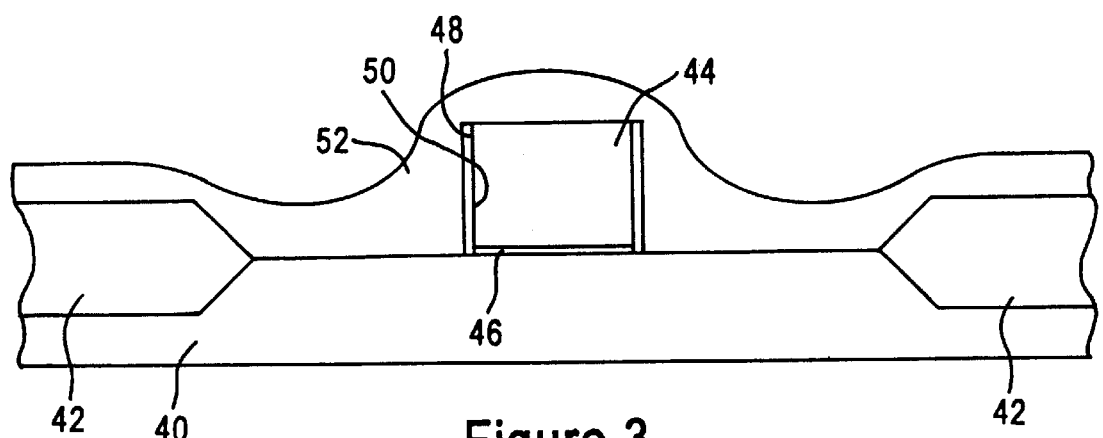
FIG. 3 is a cross-section of a portion of a semiconductor wafer during a step of a manufacturing process in accordance with an embodiment of the present invention, following the deposition of a spacer material layer.

The present invention provides a method and an arrangement that avoids the gouging of the device junction. This is accomplished by overetching the spacer material layer during the formation of the sidewall spacers. FIG. 3 depicts a portion of a semiconductor wafer during a manufacturing process in accordance with an embodiment of the present invention. The semiconductor device is formed on a silicon substrate 40. The device is isolated by field oxide shallow trench isolation areas 42 from other semiconductor devices on the wafer. A polysilicon gate 44 is formed on a gate oxide 46. LDD oxide 48 has already been formed on the sidewalls 50 of the gate 44. A layer of spacer material 52, such as silicon oxide or silicon nitride, is deposited conformally over the semiconductor wafer.

The spacer material layer 52 is now etched with a conventional etchant chemistry suitable for the particular material used in the spacer material layer 52. However, in contrast to the conventional etching techniques in which the sidewall spacers completely cover the gate sidewalls 50, the method of the present invention deliberately overetches the spacer material layer 52. The result is depicted in FIG. 4.

Figure 4:
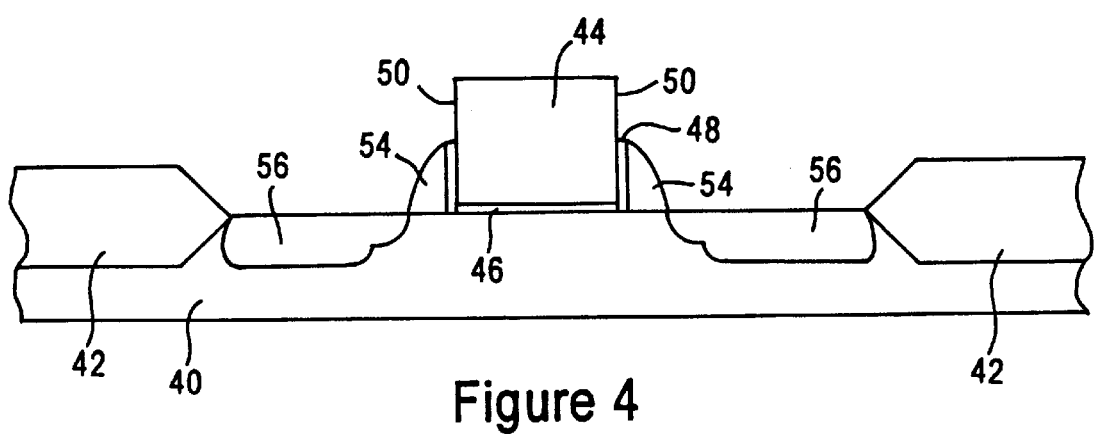
FIG. 4 depicts the portion of FIG. 3 after etching of the spacer material layer to form sidewall spacers, including an overetching of the sidewall spacers to expose portions of the gate sidewalls in accordance with an embodiment of the present invention.

As is apparent from FIG. 4, the overetching also etches portions of the LDD oxide 48; in addition to the layer of spacer material 52, exposing a portion of the gate sidewalls 50. In the process, sidewall spacers 54 are produced that cover only a portion of the gate sidewalls 50. In certain preferred embodiments of the present invention, between 20% and about 50% of the gate sidewalls 50 are covered by the sidewall spacers 54.

Once the sidewall spacers 54 are formed, dopants are introduced into the regions 56 (by implantation for example). The wafer may be heated to activate the dopants; in the active regions 56 at this time.

Hence even though the side wall spacers 54 have been overetched in their formation, they still serve their normal interred purpose of masking regions of the substrate 40 directly below from direct implantation of dopants.

Figure 5:
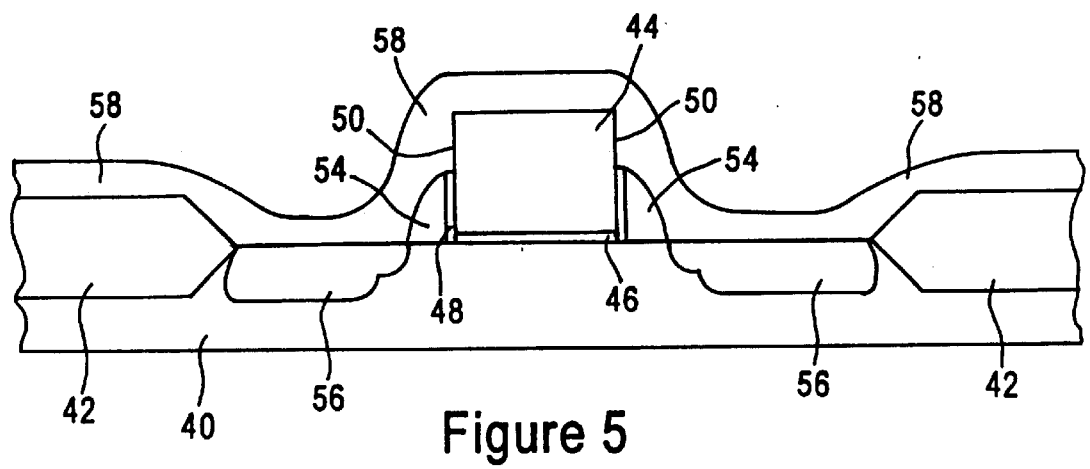
FIG. 5 depicts a portion of FIG. 4 following the implantation of dopants into the substrate to form active regions and the deposition of a refractory metal layer over the semiconductor wafer in accordance with embodiments of the present invention.
Figure 6:
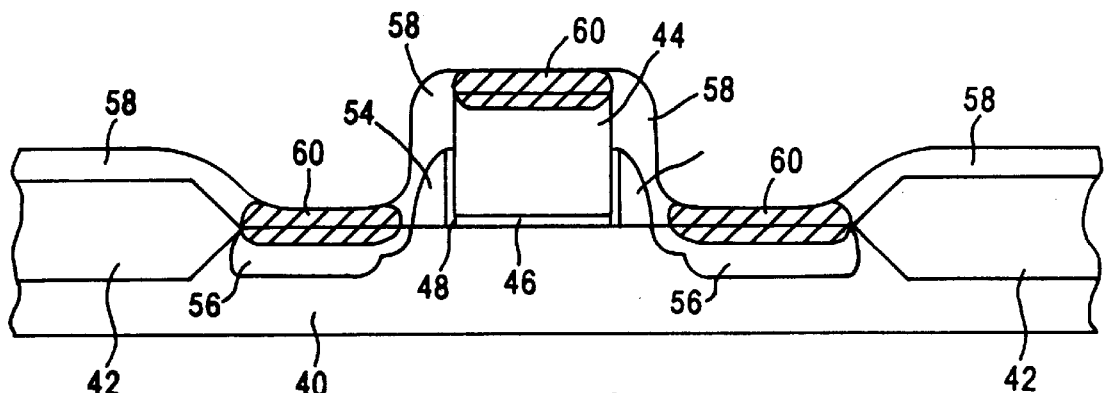
FIG. 6 depicts the portion of FIG. 5 after a heating step to form silicide regions on the gate and active regions of the semiconductor device, in accordance with embodiments of the present invention.

In FIG. 5, a refractory metal, such as cobalt or titanium, has been conformally deposited as a refractory metal layer 58 over the semiconductor wafer. Due to the overetching in accordance with the present invention, the refractory metal in the refractory metal layer 58 is in contact with the exposed portion of the gate sidewalls 50. When the semiconductor wafer is subjected to one or more heating steps, such as rapid thermal annealing, a low resistivity silicide is formed in those areas where the refractory metal layer 58 is in contact with either the polysilicon of the gate 44 or the silicon of the active regions 56. The rapid thermal annealing may be performed at conventional temperatures and other processing conditions. The resulting structure is depicted in FIG. 6 following the rapid thermal annealing steps to provide silicide regions 60 on the active regions 56 and the gate 44. As apparent from FIG. 7, the silicide region 60 on the gate 44 extends to 9 and overhangs the gate sidewalls 50. Silicide is not formed on the sidewall spacers 54 or the field oxide regions 42.

Figure 7:
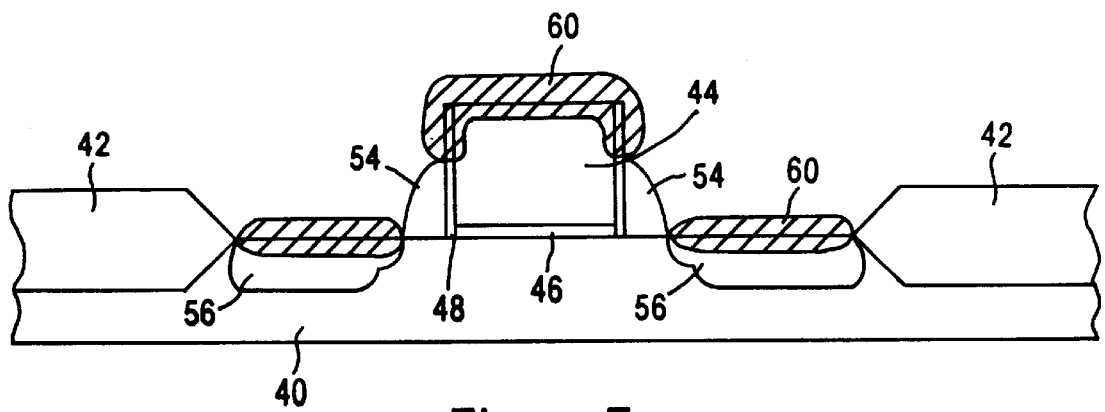
FIG. 7 depicts the removal of unreacted refractory metal from the semiconductor wafer in accordance with embodiments of the present invention.

The unreacted metal is removed by a conventional wet etch chemistry. The resulting structure is depicted in FIG. 7. A second RTA may be performed to form the low resistivity silicide ($CoSi_2$, $TiSi_2$).

Figure 8:
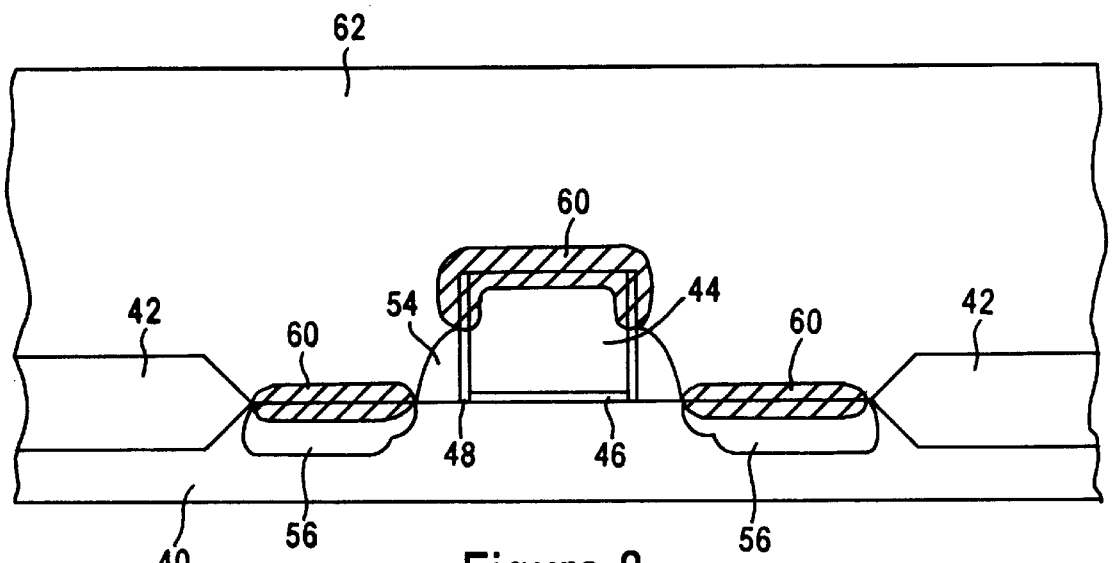
FIG. 8 depicts the portion of FIG. 7 after a dielectric layer, such as an interlayer dielectric, is deposited over the semiconductor wafer, in accordance with embodiments of the present invention.
Figure 9:
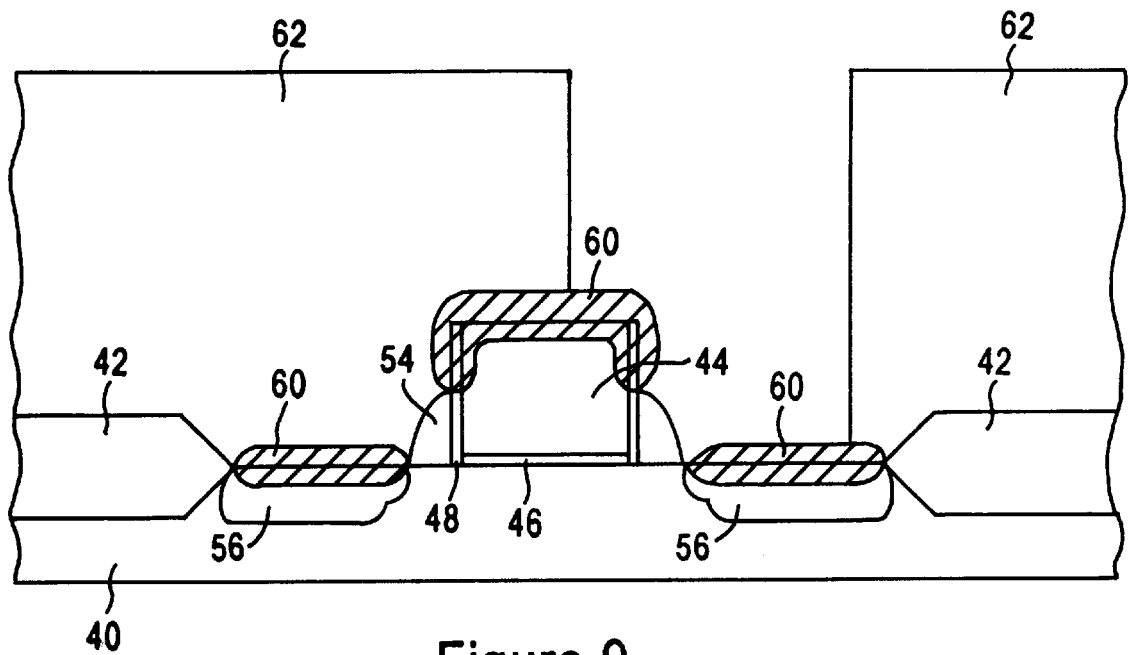
FIG. 9 depicts the portion of FIG. 8 after an opening, such as a local interconnect opening, has been etched through the dielectric layer to the silicide regions in accordance with embodiments of the present invention.

Once the silicide regions 60 are formed, the formation of the local interconnect or contact is then performed. This involves the deposition of an interlayer dielectric, such as the dielectric layer 62 (see FIG. 8) deposited over the semiconductor wafer. The dielectric material 62 may be silicon dioxide derived from TEOS, for example. Following the deposition of the dielectric layer 62, an opening is then formed by an etch that is highly selective to silicide so as not to etch through the silicide into the device or the gate, as is conventionally known. FIG. 9 depicts the semiconductor wafer after the etching of a local interconnect opening through the dielectric layer 62. The silicide region 60 which covers the gate sidewall 50 exposed by the overetching during the formation of the sidewall spacers 54 prevents the preferential attacking of the sidewall spacer 54 and the LDD oxide 48. Hence, after the local interconnect etch or contact etch is performed, the profile of the sidewall spacer 54 remain intact and gouging is prevented.

Figure 10:
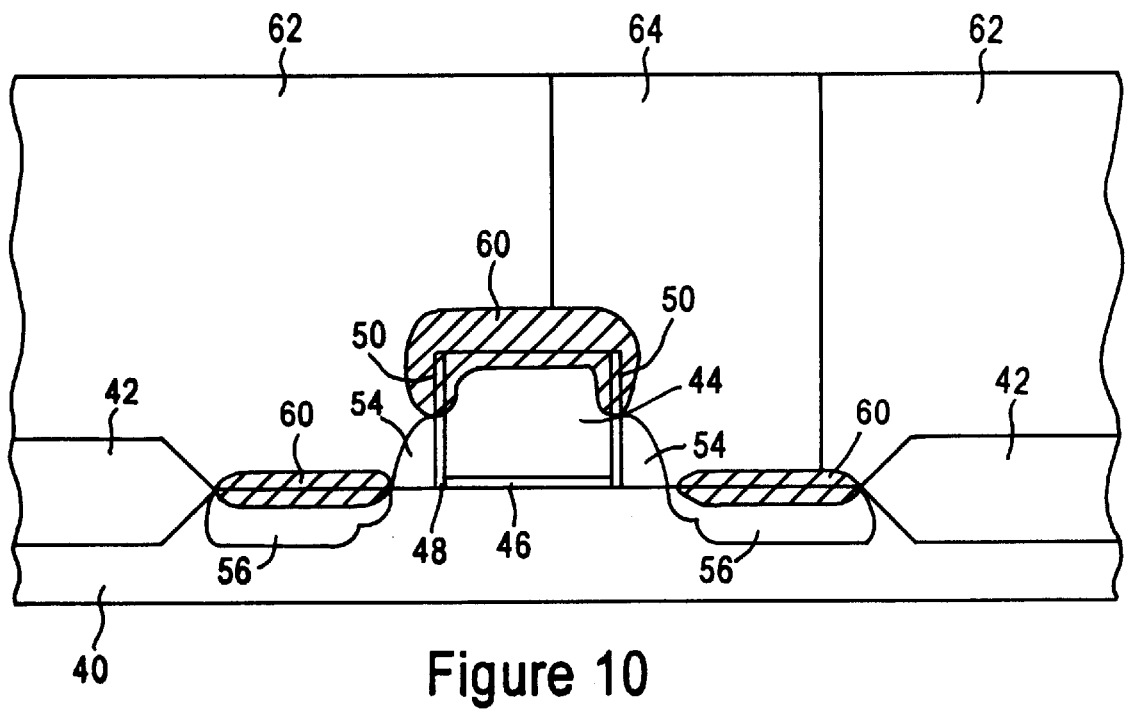
FIG. 10 depicts the portion of FIG. 9 following the filling of the etched opening with a conductive material in accordance with embodiments of the present invention.

FIG. 10 depicts the semiconductor wafer after the filling of conductive material within the interconnect opening that has been etched in the preceding step. The conductive material 64 may be tungsten, for example. The conductive material 64 serves as a local interconnect and in this example contacts both the silicide region 60 of the gate 44 and the silicide region 60 of the active region 56. Thus, as depicted in FIG. 10, an arrangement has been provided that includes a substrate 40 and a gate 44 on the substrate 40. The gate 44 has gate sidewalls 50 and a top surface. The active regions 56 are formed within the substrate 40. Sidewall spacers 54 cover a portion of the gate sidewalls 50. Silicide regions 60 are present on the active regions 56, the gate top surface and the gate sidewalls 50.

With the arrangement of the present invention and the method of making the same, the undesirable profiles and possible shorts produced during contact etching or local interconnect etching in conventional processing are avoided in an elegant manner, by the overetching of the spacer material layer during the formation of the sidewall spacers.

Although the present invention has been described and illustrated in detail, it is to be clearly understood that the same is by way of illustration and example only and is not to be taken by way of limitation, the spirit and scope of the present invention being limited by the terms of the appended claims.

What is claimed is:

1. A method of forming an electrical connection to a semiconductor device, comprising:

forming a gate on a substrate, the gate having a top surface and sidewalls;

forming an oxide layer on the sidewalls of the gate;

depositing a layer of spacer material over the substrate, the oxide layer, and the gate;

etching the layer of spacer material and the oxide layer to form sidewall spacers on the oxide layer, wherein the etching is performed such that: no portion of the oxide layer and no portion of the sidewall spacers extend above the top surface of the gate; portions of the gate sidewalls are free of the oxide layer and the spacer material; and other portions of the gate sidewalls are covered by the oxide layer and the sidewall spacers;

forming active regions in the substrate; and forming a silicide on the active regions of the substrate and on the semiconductor device, with silicide forming on the top surface and the portions of the gate sidewalls that are free of the oxide layer and the spacer material, wherein the silicide formed on the gate sidewalls overhangs the oxide layer and the sidewall spacers.

2. The method of claim 1, further comprising the steps of:

depositing a dielectric layer over the substrate, gate and silicide;

etching a hole in the dielectric layer to the suicide; and filling the hole with a conductive material.

3. The method of claim 2, wherein the step of etching the spacer material and the oxide layer includes performing a timed etch such that between about 20% and about 50% of the gate sidewalls are free of spacer material and the oxide layer.

4. The method of claim 3, wherein the spacer material is an oxide.

5. The method of claim 4, wherein the silicide is titanium silicide.

6. The method of claim 2, wherein the step of forming a silicide on the semiconductor device includes depositing a refractory metal layer on the semiconductor device and performing a heat treatment to form low resistivity silicide regions.

7. A method of preventing gouging of device junctions during the formation of an electrical connection to the device junctions, comprising the steps of:

forming an oxide layer on sidewalls of a gate of a semiconductor device having active regions and a gate with a top surface and sidewalls;

forming a spacer layer over the oxide layer;

etching the oxide layer and the spacer layer to form sidewall spacers, including over-etching the oxide layer and the sidewall spacers to remove the oxide layer and the sidewall spacers from portions of the gate sidewalls so that a top surface of the oxide layer and the sidewall spacers is below the top surface of the gate; and forming silicide regions on the active regions, the gate top surface and the gate sidewalls, wherein the suicide formed on the gate sidewalls overhangs the oxide layer and the spacer material.

8. The method of claim 7, further comprising:

depositing a dielectric layer over the semiconductor device;

etching an opening through the dielectric layer to at least one of the silicide regions; and filling the opening with a conductive material.

9. The method of claim 7, wherein the oxide layer and the sidewall spacers are removed from between about 20% to about 50% of the gate sidewalls.

10. The method of claim 4, wherein the suicide is cobalt silicide.

11. The method of claim 4, wherein the silicide is nickel silicide.

* * * * *